United States Patent [19]

Weresch

[11] 4,249,581
[45] Feb. 10, 1981

[54] APPARATUS FOR CUTTING TO LENGTH, BENDING AND CRIMPING THE CONNECTING WIRES OF ELECTRICAL COMPONENTS

[76] Inventor: Thomas Weresch, Greschbachstr. 19, D-7500 Karlsruhe 41, Fed. Rep. of Germany

[21] Appl. No.: 963,219

[22] Filed: Nov. 24, 1978

[51] Int. Cl.³ .............................................. B21F 45/00
[52] U.S. Cl. .................................................... 140/105
[58] Field of Search ........................................ 140/105

[56] References Cited

U.S. PATENT DOCUMENTS

| | | | |
|---|---|---|---|
| 1,313,509 | 8/1919 | Vincent | 140/105 |
| 2,634,576 | 4/1953 | Seibel | 140/71 R |
| 3,900,053 | 8/1975 | Weresch | 140/105 |

OTHER PUBLICATIONS

IBM Technical Disclosure Bulletin, vol. 18, No. 8, Jan. 1976, pp. 2493 & 2494.

Primary Examiner—Lowell A. Larson
Attorney, Agent, or Firm—Craig & Antonelli

[57] ABSTRACT

An apparatus for cutting to length, bending and crimping the connecting wires of electrical components. The functions are provided by toothed wheels on a common shaft which transport the components and which co-act with cutting, crimping and bending tools. In order to ensure that after crimping, the components do not shift before the bending operation, the toothed wheels co-operating with the crimping tools are provided with radially arranged grooves which open into the bottom of each tooth space to engage the crimped wires and prevent rotation of the component about the wire axis.

4 Claims, 6 Drawing Figures

APPARATUS FOR CUTTING TO LENGTH, BENDING AND CRIMPING THE CONNECTING WIRES OF ELECTRICAL COMPONENTS

This application is a substitute for applicant's earlier U.S. application Ser. No. 793,505, filed May 4, 1977, and abandoned before the filing hereof.

The invention relates to apparatus for cutting to length, bending and crimping the connecting wires of individual electrical components, or such components arranged in series in a band of components, by means of toothed conveying wheels which are arranged on a shaft and which engage the components, and associated holders arranged between the toothed conveying wheels on the shaft, in the form of toothed wheels, and crimping tools associated with the said associated holders.

For fitting conductor plates with electrical components such as resistances, capacitors, diodes or the like, to facilitate mounting, the component connecting wires which are cut to selected lengths and bent are provided with feet which are hereinafter referred to as crimps. Components with such crimps are advantageous more particularly in the automatic fitting of conductor plates with electrical components, since the components are located in previously drilled holes in the plate by the crimps, so that the completely fitted conductor plate can be soldered at the rear side in a subsequent single operation, in a splash bath. The crimps can be of various shapes depending on the intended purpose. They are often produced as corrugations and are arranged in the region of the ends of the connecting wires of the components, whereby the component can be inserted in the previously drilled holes with elastic yielding of the connecting wires, and held in the inserted position.

An apparatus for cutting to length and bending the connecting wires of electrical components arranged in a band-like series is already known (German laid-open specification No. 1,916,514). It comprises toothed conveying wheels engaging the components. The components are guided at their connecting wires by the flanks of the teeth of the toothed conveying wheels past cutting tools which cut the connecting wires to a desired length, and these serve at the same time as bending tools when the cut component is transported further by the toothed conveying wheels.

A disadvantage of this apparatus is that it is not intended for forming crimps in the connecting wires of the electrical components, so that electrical components processed by this known apparatus cannot be used for automatic fitting on conductor plates.

An apparatus proposed in my U.S. Pat. No. 3,900,053 issued Aug. 19, 1975, provides a remedy in this connection. This apparatus comprises toothed wheels for forming crimps and acting as associated holders which are arranged between the toothed conveying wheels and on a common shaft with the latter, a crimping tool arranged on the housing being associated with each of the said associated holders. The crimping tool is constructed as a forming roller provided with a peripheral groove the axis of which is parallel to the shaft. The component transported by the toothed conveying wheels is first of all cut to a desired length with its connecting wires by cutting rollers which are arranged on the housing and co-operate with the toothed conveying wheels, and then the crimp is formed in the connecting leads by means of the forming roller during further transport. Then the connecting wires are bent in the desired manner.

After the crimping operation and before the following bending operation on the connecting wires, the component is not secured relatively to the toothed conveying wheels and toothed crimping wheels, and on the contrary because of very small vibrations produced by unsteady running it may vary its position relatively to the toothed conveying wheels. If this happens the crimp also modifies its radial position relatively to the toothed conveying wheel, so that at the following bending operation wherein the connecting wires are bent-as in the case of the crimp-in the radial direction relatively to the toothed conveying wheels, finished components are produced whose crimps and connecting wires are not situated in a common plane. Components with crimps formed in this way, however, are undesirable for various reasons. For example components with such crimps do not stand upright in the holes in the conductor plate but lean over slightly to one side, and in the case of two components arranged near one another on a plate this may result in the components being inclined towards one another or even contacting one another, which would result in them being subjected to thermal overload, resulting in early failure of the circuit in which they are arranged.

The invention has as its object to provide an apparatus of the kind initially described that can produce electrical components with crimps which are situated in a single plane with the bent components.

This object is achieved according to the present invention in that each toothed associated holder wheel comprises radially arranged grooves on at least one face, which grooves open into the bottom of each tooth space.

The construction affords the advantage that when the crimps are formed they are pressed into the groove or grooves, retaining their relative position with respect to the toothed conveying wheels. Because of this construction, in the following bending operation each connecting wire is bent in a radial direction relatively to the toothed conveying wheels and thus in the same direction as the crimps. The electrical components thus formed comprise crimps which are situated in the plane of the bent-over ends of the connecting wires.

It is not necessary to arrange the grooves on both faces of the toothed associated holder wheels and on the contrary it is sufficient to arrange the grooves at one end face. According to a preferred constructional form of the invention the grooves are arranged at that face of each toothed association holder wheel which is remote from the neighbouring toothed conveying wheel, where generally the crimp has a relatively long ascent so that it is secured more satisfactorily in the grooves opening into the bottom of the tooth space.

Further details and advantages of the invention will become clear from the following description of a preferred constructional form of the invention shown in the drawings. In the drawings.

Figure 1:
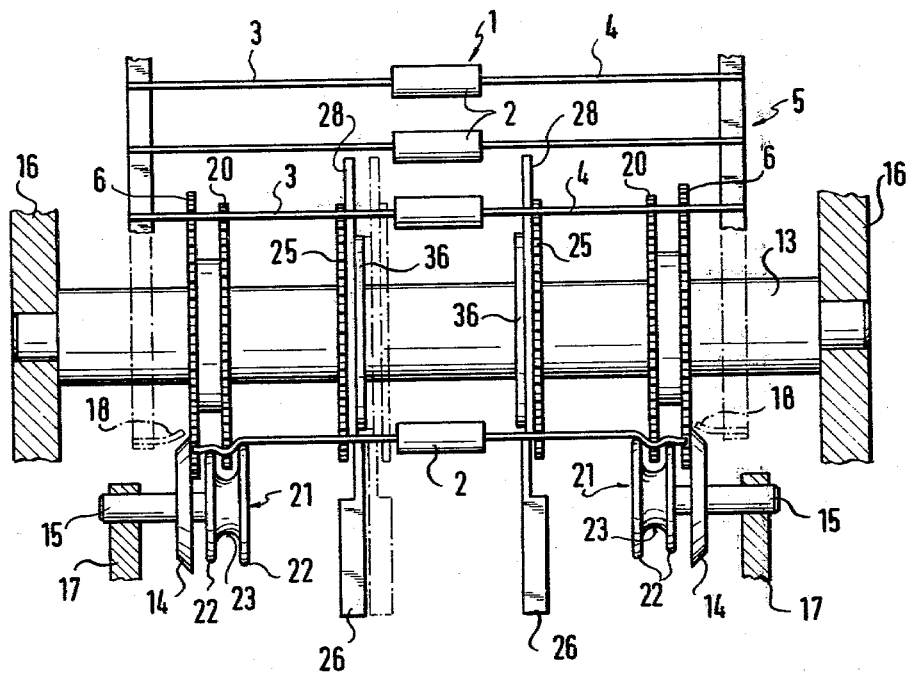
FIG. 1 shows the shaft with the various toothed wheels and tools in plan view.
Figure 2:
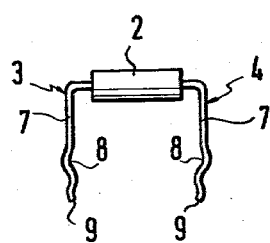
FIG. 2 shows a constructional form of a component with crimps for horizontal fitting in a conductor plate.
Figure 3:
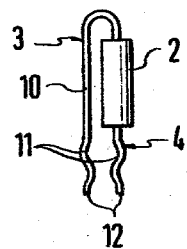
FIG. 3 shows another constructional form of a component with crimps for fitting vertically in a conductor plate.

In FIG. 1 the electrical components 1, which consist of the component body 2 and the connecting wires 3, 4, are connected to one another to form a band 5 of components arranged in succession to one another in the manner of the rungs of a ladder. This band 5 is wound for example on a supply reel not shown here and is unwound from the reel by means of toothed conveying wheels 6. Instead, the components 1 could also be presented singly and fed by hand by means of a chute or the like to the toothed conveying wheels 6. The untreated components 1 which are to be dealt with have to have their connecting wires treated so that they can be inserted in an electrical circuit, for example a printed circuit, on a conductor plate. FIGS. 2 and 3 show relatively complicated constructional forms of components as they look in their final state, and which can be produced with the apparatus shown in FIGS. 1 and 4 to 6.

With the component shown in FIG. 2 the two connecting wires 3, 4 are each bent over through 90° relatively to the body 2. Each connecting wire 3, 4 comprises a straight portion 7 followed in each case by a crimp 8 in the form of a corrugation. The end 9 of each wire is again bent inwards with a slight corrugation.

The component shown in FIG. 3 is set up in a position at right angles to the circuit plate, that is to say vertically. Consequently the connecting wire 3 has to bent over through 180° relatively to the body 2 of the component, whereas the connecting wire 4 is not bent. Furthermore the connecting wire 3 has to be very long whereas the connecting wire 4 has to be cut off short; consequently the connecting wire 3 has a long straight portion 10 followed by a crimp 11 and a corrugated end 12, whereas the connecting wire 4 consists substantially only of the crimp 11 and the corrugated end 12.

The toothed conveying wheels 6 are mounted on a shaft 13 (FIGS. 1 and 4) and are secured to be capable if axial displacement, for example by means of sleeves not shown in the drawings which are also mounted on the shaft 13 through the agency of a lockable tongue and groove connection. The shaft 13 is advantageously driven by a continuously variable motor not shown here. The toothed conveying wheels 6 are used not only for conveying the components 1, but at the same time also as associated holders for cutting tools 14 which are arranged opposite the toothed wheels 6. In the illustrated constructional example the cutting tools 14 are constructed as cutting discs and arranged with a shaft 15 on the housing 16 or a bearing bracket 17 connected to the said housing. As they pass the cutting discs 14, the connecting wires 3, 4 are cut to a desired length, the surplus piece of wire 18 being carried onwards with the band 5.

Adjacent the toothed conveying wheels 6, separated by a spacer flange and offset in an inward direction, there are arranged two further toothed wheels 20, the so-called toothed associated holder wheels or crimping wheels. They are also arranged to be capable of displacement on the shaft 13 and are used as associated holders for the crimping tools 21 which determine the shape of the crimps 8, 11 (FIGS. 2,3) associated opposite them and constructed in the constructional example as forming rollers with two edge discs 22 and a peripheral groove 23. In the drawings, the forming roller 21 is integral with the cutting disc 14, in other words it is arranged on the same shaft 15. By arranging the bearing bracket 17 to be adjustable in the direction of the double arrow 24 (FIG. 4) the forming roller 21 can engage to a more or less considerable extent over the toothed associated holder wheel 20 so that the depth of the crimp 8 or 11 can be adjusted. Naturally, the crimping tool 21 and the cutting disc 14 may also be separate components and may if necessary be capable of adjustment relatively to one another.

Figure 4:
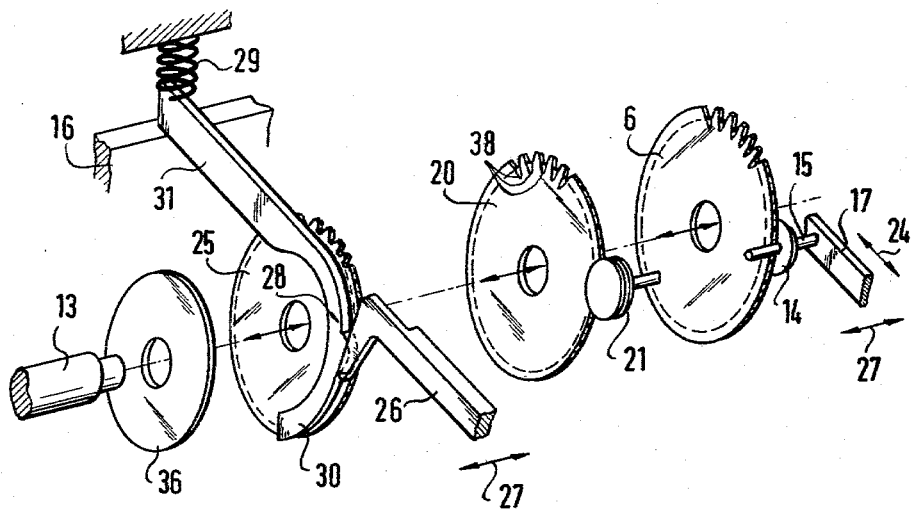
FIG. 4 shows an exploded view of the right-hand half of the apparatus according to FIG. 1.

Between the two toothed conveying wheels 6 and the associated holder wheels 20 for crimping there are arranged, offset inwardly, two toothed bending wheels 25 which at the same time are used as associated holders for bending tools 26 arranged opposite them. The latter themselves are arranged on the housing 16 so as to be capable of displacement in the direction of the double arrow 27 (FIG. 4). In the same way the toothed bending wheels 25 are capable of adjustment, so that their spacing for example can be adjusted to the length of the component body 2. By suitable adjustment of the toothed conveying wheels and the toothed associated holder wheels for crimping, the length of the connecting wires 3, 4 and the situation of the crimp 9 or 11 can be selected appropriately. With the bending tool 26 a tension relief element 28 arranged opposite it co-operates which is supported on the housing 16 by means of a spring 29, (FIG. 4) so that between it and the bending tool 26 a variable gap is provided which is adjusted automatically in accordance with the diameter of the connecting wires 3, 4. When the apparatus is in operation, the connecting wires 3, 4 are bent outwards—downwards in FIG. 1—in the gap between the toothed bending wheel 25 and the bending tool 26, the component being clamped between the toothed bending wheels and released by means of an ejector.

Figure 5:
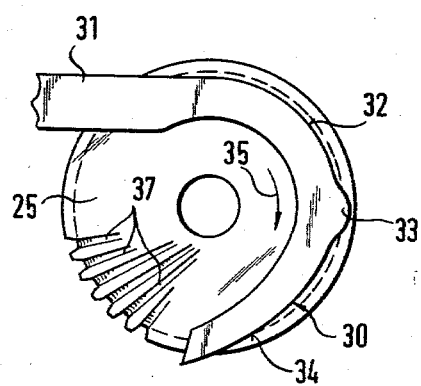
FIG. 5 shows an end face view of the toothed bending wheel with a tension relief element and an ejector and FIG. 6 shows an end face view of a toothed associated holder wheel.
Figure 6:
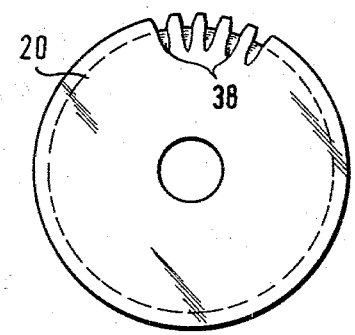

FIGS. 4, 5 show a constructional form of an ejector 30. It is a part of an arm 31 supported on the springs 29 and taken approximately tangentially to the toothed bending wheel 25 and then having a contour 32 similar to the said toothed bending wheel with a slightly smaller external diameter. The end edge of the arm 31 is shaped in the region of the bending tool 26 to constitute a nose 33 which is used as a tension relief element. Towards the lower vertex point of the toothed bending wheel 25, the arm 31 comprises a contact surface 34 which forms the ejector 30 and which intersects the outside circle thereof in the peripheral direction 35. The components run against this contact surface 34 and are detached from the toothed bending wheels 25 as they do so. For axial fixing of the arm 31 there is provided a disc 36. In order to avoid the components 1 becoming jammed between the bending tools 26 in the bending operation (FIG. 1), the toothed bending wheels 25 comprise at their internal faces grooves 37 which start from the bottom of each tooth space and extend inwards. The connecting wires 3, 4 are pressed into these grooves during bending so that in every case they are carried along by the toothed bending wheels 25 as these rotate.

In order to prevent the components turning after the crimping operation and during the subsequent bending operation, thereby modifying the radial position of the crimp relatively to the toothed conveying wheels and toothed bending wheels 25, each toothed associated holder wheel 20—as with the toothed bending wheels 25—comprises at the face remote the particular adjacent toothed conveying wheel 6 radially arranged grooves 38 which open into the bottom of each tooth space and into which the crimp is pressed during the crimping operation. In this way the crimps retain their radial position relatively to the toothed conveying wheels, so that the ends of the connecting wires of the components are bent in the same plane as that in which the two crimps of each component are situated.

What is claimed is:

1. In a device for cutting to length, crimping and bending of lead wires extending from electrical components of the type having transport sprocket wheels mounted upon a rotatable shaft, bending means for bending said leads, at least one corrugating sprocket wheel with a plurality of teeth and spaces therebetween mounted on said shaft between each transport sprocket wheel and a neighboring bending means, and corrugating tool means for cooperating with said corrugating sprocket wheels to corrugate said leads, the improvement comprising retaining means for preventing rotation of corrugated leads relative to said sprocket wheels to properly orient said leads for subsequent bending thereof, said retaining means being formed by radially arranged grooves on at least one side surface of said corrugating sprocket wheels, said grooves opening into each tooth space and extending radially inwardly therefrom.

2. A device as claimed in claim 1, in which the grooves are arranged on that face of each toothed holder wheel which is remote from the neighbouring transport sprocket wheel.

3. A device as claimed in claim 1, in which the bending means consists of bending sprocket wheels arranged on the said shaft so as to rotate therewith and associated bending tools.

4. A device as claimed in claim 3, in which the bending sprocket wheels and associated tools are displaceable axially of the shaft until the bending tools abut one another.

* * * * *